(12) United States Patent
Mutyala et al.

(10) Patent No.: US 11,430,654 B2
(45) Date of Patent: *Aug. 30, 2022

(54) INITIATION MODULATION FOR PLASMA DEPOSITION

(71) Applicant: Applied Materials, Inc., Santa Clara, CA (US)

(72) Inventors: Madhu Santosh Kumar Mutyala, Santa Clara, CA (US); Sanjay Kamath, Fremont, CA (US); Deenesh Padhi, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 165 days.

This patent is subject to a terminal disclaimer.

(21) Appl. No.: 16/698,500

(22) Filed: Nov. 27, 2019

(65) Prior Publication Data

US 2021/0159073 A1    May 27, 2021

(51) Int. Cl.
*H01L 21/31* (2006.01)
*H01L 21/02* (2006.01)
(Continued)

(52) U.S. Cl.
CPC .... *H01L 21/02274* (2013.01); *C23C 16/4584* (2013.01); *C23C 16/50* (2013.01);
(Continued)

(58) Field of Classification Search
CPC ......... H01L 21/02164; H01L 21/02208; H01L 21/02214; H01L 21/02274; C23C 16/50; H01J 37/32009; H01J 37/32412
(Continued)

(56) References Cited

U.S. PATENT DOCUMENTS

2002/0094388 A1  7/2002  Fonash et al.
2007/0079753 A1  4/2007  Padhi et al.
(Continued)

FOREIGN PATENT DOCUMENTS

| KR | 10-1913443 B1 | 10/2018 |
|---|---|---|
| WO | 2011-049800 A2 | 4/2011 |
| WO | 2018-063804 A1 | 4/2018 |

OTHER PUBLICATIONS

International Search Report and Written Opinion dated Mar. 9, 2021 in International Patent Application No. PCT/US2020/061938, 10 pages.
(Continued)

*Primary Examiner* — Brook Kebede
(74) *Attorney, Agent, or Firm* — Kilpatrick Townsend & Stockton LLP

(57) ABSTRACT

Exemplary deposition methods may include forming a plasma of an oxygen-containing precursor within a processing region of a semiconductor processing chamber. The processing region may house a semiconductor substrate on a substrate support. The methods may include, while maintaining the plasma of the oxygen-containing precursor, flowing a silicon-containing precursor into the processing region of the semiconductor processing chamber at a first flow rate. The methods may include ramping the first flow rate of the silicon-containing precursor over a period of time to a second flow rate greater than the first flow rate. The methods may include depositing a silicon-containing material on the semiconductor substrate.

20 Claims, 3 Drawing Sheets

(51) Int. Cl.
  *H01J 37/32*    (2006.01)
  *C23C 16/458*   (2006.01)
  *C23C 16/50*    (2006.01)

(52) U.S. Cl.
  CPC .. *H01J 37/32137* (2013.01); *H01L 21/02164* (2013.01); *H01L 21/02214* (2013.01); *H01J 37/32183* (2013.01); *H01J 2237/24564* (2013.01); *H01J 2237/3321* (2013.01)

(58) Field of Classification Search
  USPC .......................................................... 438/761
  See application file for complete search history.

(56) References Cited

U.S. PATENT DOCUMENTS

| | | | | |
|---|---|---|---|---|
| 2009/0197401 A1* | 8/2009 | Li | ............................ | C23C 14/48 |
| | | | | 438/513 |
| 2010/0267224 A1* | 10/2010 | Choi | ................. | H01J 37/32862 |
| | | | | 438/513 |
| 2012/0003842 A1* | 1/2012 | Ueda | ...................... | C23C 16/511 |
| | | | | 438/788 |
| 2017/0076956 A1* | 3/2017 | Hirayama | ............ | H01J 37/3266 |

OTHER PUBLICATIONS

Application No. PCT/US2020/061938 , International Preliminary Report on Patentability, dated Jun. 9, 2022, 8 pages.

\* cited by examiner

INITIATION MODULATION FOR PLASMA DEPOSITION

TECHNICAL FIELD

The present technology relates to semiconductor systems and processes. More specifically, the present technology relates to methods of depositing materials with controlled stress effects.

BACKGROUND

Integrated circuits are made possible by processes which produce intricately patterned material layers on substrate surfaces. Producing patterned material on a substrate requires controlled methods of formation and removal of exposed material. Material properties of films produced may contribute to substrate effects, which may cause wafer bowing or other challenges during processing.

Thus, there is a need for improved systems and methods that can be used to produce high quality devices and structures. These and other needs are addressed by the present technology.

SUMMARY

Exemplary deposition methods may include forming a plasma of an oxygen-containing precursor within a processing region of a semiconductor processing chamber. The processing region may house a semiconductor substrate on a substrate support. The methods may include, while maintaining the plasma of the oxygen-containing precursor, flowing a silicon-containing precursor into the processing region of the semiconductor processing chamber at a first flow rate. The methods may include ramping the first flow rate of the silicon-containing precursor over a period of time to a second flow rate greater than the first flow rate. The methods may include depositing a silicon-containing material on the semiconductor substrate.

In some embodiments, the silicon-containing precursor may be or include tetraethyl orthosilicate. The period of time may be less than or about 10 seconds. Ramping the first flow rate may occur at a constant increase of from about 2 grams per second of the silicon-containing precursor to about 5 grams per second of the silicon-containing precursor. The depositing may be performed at a temperature of less than or about 450° C. The processing region of the semiconductor processing chamber may be maintained free of the silicon-containing precursor while forming the plasma of the oxygen-containing precursor. The semiconductor substrate may be or include silicon, and forming the plasma of the oxygen-containing precursor may produce an oxygen-radicalized surface termination of the silicon of the semiconductor substrate. The methods may include, subsequent depositing a first amount of the silicon-containing material, halting delivery of the silicon-containing precursor while maintaining a flow rate of the oxygen-containing precursor. The methods may include extinguishing a plasma within the processing region of the semiconductor processing chamber while maintaining a flow rate of the oxygen-containing precursor. The methods may include reforming a plasma of the oxygen-containing precursor, and reflowing the silicon-containing precursor into the processing region of the semiconductor processing chamber.

Some embodiments of the present technology may encompass deposition methods. The methods may include flowing an oxygen-containing precursor into a processing region of a semiconductor processing chamber. The processing region may house a semiconductor substrate on a substrate support. The methods may include forming a plasma of the oxygen-containing precursor. The methods may include flowing a silicon-containing precursor into the processing region of the semiconductor processing chamber. The methods may include increasing the flow rate of the silicon-containing precursor over a period of time. The methods may include depositing a first amount of a silicon-containing material on the semiconductor substrate. The methods may include halting a flow of the silicon-containing precursor and formation of the plasma, while maintaining a flow rate of the oxygen-containing precursor.

In some embodiments, the oxygen-containing precursor may be or include diatomic oxygen. The methods may include reforming the plasma of the oxygen-containing precursor. The methods may include reflowing the silicon-containing precursor into the processing region of the semiconductor processing chamber. The methods may include increasing the flow rate of the silicon-containing precursor over the period of time. The methods may be repeated at least five times. The semiconductor substrate may be characterized by a recessed feature, and sidewall coverage proximate a bottom of the recessed feature may be greater than or about 75% the thickness of sidewall coverage proximate a top of the recessed feature.

The present technology may encompass deposition methods. The methods may include forming a plasma of an oxygen-containing precursor within a processing region of a semiconductor processing chamber. The processing region may house a semiconductor substrate on a substrate support. The methods may include, while maintaining the plasma of the oxygen-containing precursor, flowing a silicon-containing precursor into the processing region of the semiconductor processing chamber at a first flow rate. The methods may include ramping the first flow rate of the silicon-containing precursor over a first period of time to a second flow rate greater than the first flow rate. The methods may include depositing a first amount of silicon-containing material on the semiconductor substrate. The first amount of silicon-containing material may be characterized by a tensile stress. The methods may include ramping the first flow rate of the silicon-containing precursor over a second period of time from the second flow rate to the first flow rate. The methods may include depositing a second amount of silicon-containing material on the semiconductor substrate. The second amount of silicon-containing material may be characterized by a compressive stress.

In some embodiments, a stack of silicon-containing material deposited may be characterized by a substantially neutral stress. The first amount of silicon-containing material may be characterized by a different thickness than the second amount of silicon-containing material on the semiconductor substrate. The method may be repeated at least five times. The silicon-containing precursor may be or include tetraethyl orthosilicate, and the oxygen-containing precursor may be or include diatomic oxygen.

Such technology may provide numerous benefits over conventional systems and techniques. For example, the processes may produce films characterized by reduced film shrinking. Additionally, the operations of embodiments of the present technology may produce improved interfacial density of materials on a substrate, which may reduce undercut during subsequent etching. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
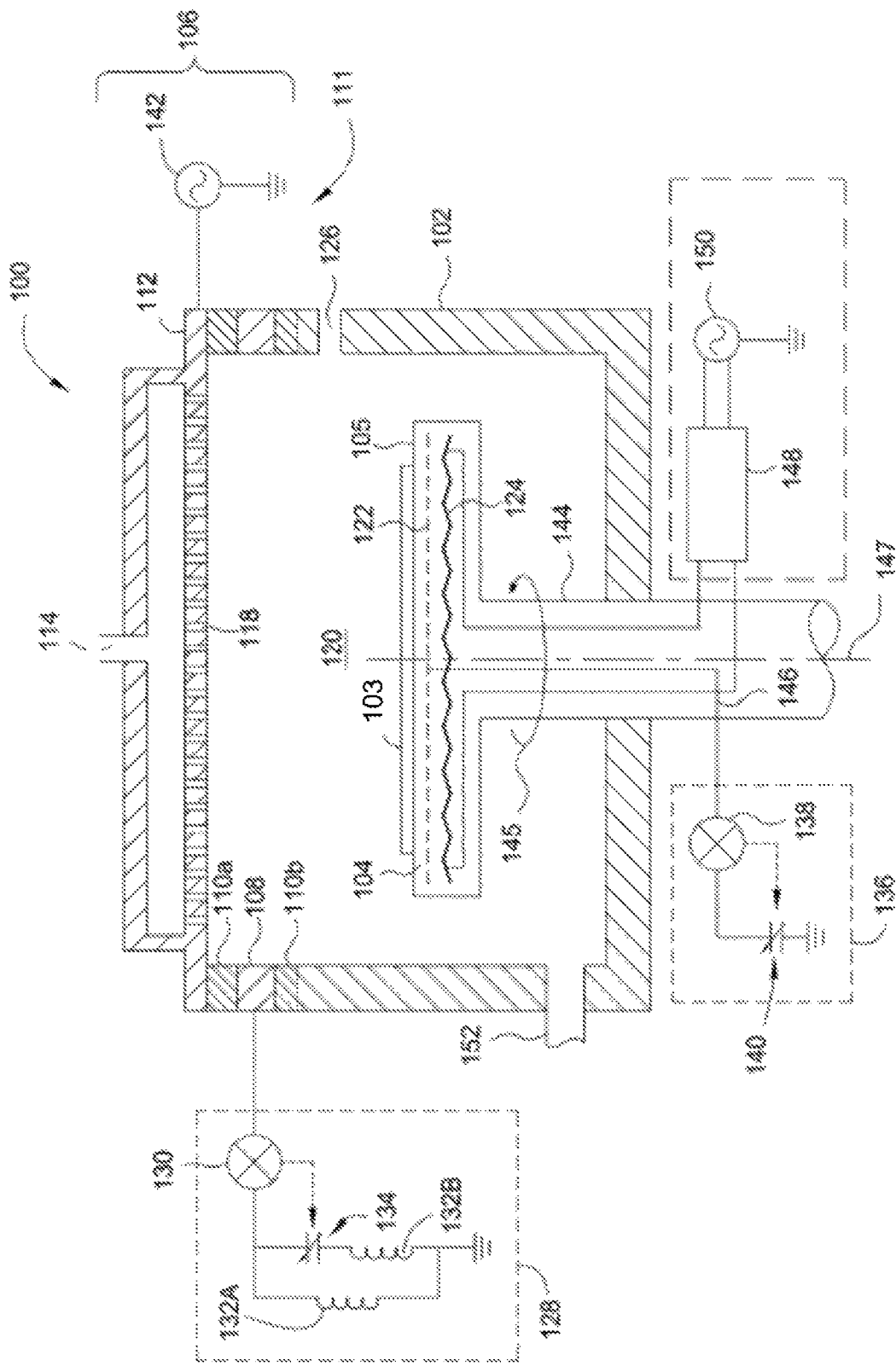
FIG. 1 shows a schematic cross-sectional view of an exemplary processing chamber according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

During semiconductor fabrication, structures may be produced on a substrate utilizing a variety of deposition and etching operations. Silicon oxide and other silicon-containing materials are routinely formed in a number of operations for developing semiconductor substrates. Silicon oxide, as one example, may be deposited in a number of processes including chemical vapor deposition and plasma deposition. Silicon oxide deposited or formed in some processes may be characterized by an amount of hydrogen and/or carbon incorporated in the film, which may have been included in the precursors, such as silane or tetraethyl orthosilicate. During subsequent processing, the silicon oxide film may be exposed to high temperatures, such as during subsequent annealing, for example. This high temperature exposure may cause an amount of outgassing of residual materials incorporated during the deposition process, which may cause the film to shrink.

To limit shrinking effects, some conventional technologies may produce denser oxide films, however, the denser films may exhibit increased internal stress. Silicon oxide may be characterized by a compressive stress, and when shrinking or densifying, the compressive stress may increase. This may cause high aspect ratio features to buckle, and in some circumstances may cause substrate or wafer bowing. Additionally, silicon oxide may be a relatively porous film, and processing with certain silicon precursors, such as tetraethyl orthosilicate, may produce lower density, more porous films. While some processes, such as gap filling and low quality formation, may be improved, interfacial regions of the film and an underlying substrate may be characterized by porous and weaker film coverage. During subsequent etch processing, such as dry or wet etching, upon reaching the underlying substrate, the etchant may undercut the deposited film along the interfacial region between the deposited film and the substrate, which may lead to further peeling and film degradation during subsequent polishing or processing operations.

Conventional techniques have addressed this issue by often utilizing alternative precursors for deposition, or performing higher temperature depositions, which may increase film density. Some techniques have also utilized nitrous oxide as an oxidizer, although this may reduce deposition rates substantially, and may also incorporate nitrogen in the film, affecting film properties. The present technology may overcome these limitations by priming a substrate surface and forming a higher quality interface. The present techniques may beneficially receive the improved deposition rates of using oxygen in some embodiments, without the detrimental loss of quality. Additionally, by improving interfacial film quality, deposition may be performed at lower temperatures, which may increase deposition rates over conventional processes. The present technology may also allow controlled adjustment to film stress in situ by modulating formation parameters. After describing general aspects of a chamber according to embodiments of the present technology in which plasma processing may be performed, specific methodology and component configurations may be discussed. It is to be understood that the present technology is not intended to be limited to the specific films and processing discussed, as the techniques described may be used to improve a number of film formation processes, and may be applicable to a variety of processing chambers and operations.

FIG. 1 shows a cross-sectional view of an exemplary processing chamber 100 according to some embodiments of the present technology. The figure may illustrate an overview of a system incorporating one or more aspects of the present technology, and/or which may perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Tetraethyl orthosilicate ("TEOS") may be characterized by a lower sticking coefficient than other silicon-containing precursors, such as silane. While this effect may improve gap fill with reduced voids and overhang, this may similarly produce films with increased porosity and lower density. Although these characteristics may be sought in the bulk of the film being deposited, which may provide easier removal or etching, for example, increased porosity at an interface region may cause other challenges. For example, subsequent deposition, etching processes may be performed. When these etch materials reach the substrate, an undercut may occur to the film at the interfacial region when the films are more porous. This may cause film peeling or chipping, which may be furthered with polishing operations.

Although densifying operations, such as anneals, may improve this density, the anneal may densify the bulk of the film as well, which may remove the lower density sought, and may increase tensile stress through the film. This increased stress may also cause film peeling or other effects. Consequently, many conventional operations perform these depositions at relatively high temperatures, such as greater than or about 400° C., or greater than or about 500° C., which increases density throughout the film, but may be less than from an anneal. Because TEOS may deposit with more of a condensation-style effect, increased temperatures may also reduce the deposition rate.

The present technology may also improve low temperature deposition of oxide films deposited with TEOS by improving interfacial density of the film, and increasing deposition rate over conventional techniques. Additionally, the present technology may allow modification to the film properties during deposition. The processes may include ramping a rate of TEOS introduction into the processing chamber after radicalizing an interfacial surface of the substrate. This may improve bonding and lower porosity of the interfacial layer, and may facilitate formation of higher density films.

Figure 2:
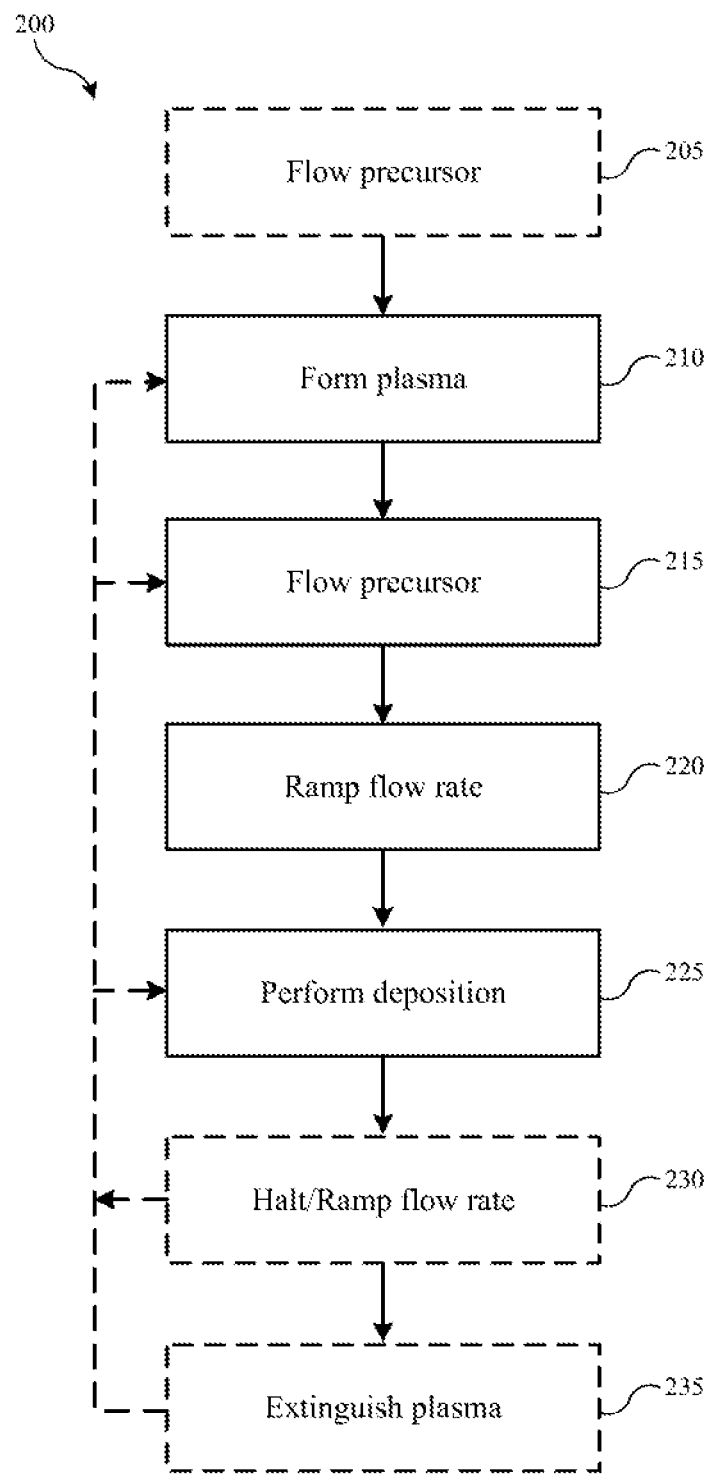
FIG. 2 shows exemplary operations in a deposition method according to some embodiments of the present technology.

FIG. 2 shows exemplary operations in a method 200 of deposition according to some embodiments of the present technology. The method may be performed in one or more chambers, including any of the chambers previously described, and which may include any previously noted components, or utilize any methodology previously discussed subsequent processing. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated. For example, and as described previously, operations may be performed prior to delivering a substrate into a processing chamber, such as processing chamber 100 described above, in which method 200 may be performed.

Method 200 may include flowing an oxygen-containing precursor into a processing region of a semiconductor processing chamber at optional operation 205. Although any number of oxygen-containing precursors may be used in embodiments of the present technology, in some embodiments the oxygen-containing precursor may be diatomic oxygen. The methods may include forming a plasma of an oxygen-containing precursor within a processing region of a semiconductor processing chamber at operation 210. The processing region may house a substrate, such as on a substrate support, and on which the deposition process may be performed. Any number of oxygen-containing precursors may be utilized including diatomic oxygen, ozone, nitrogen-containing precursors that incorporate oxygen, water, alcohol, or other materials. During the plasma formation initially, the processing region may be maintained substantially or completely free of a silicon-containing precursor, such as TEOS or any other silicon-containing precursor. Any number of inert or carrier gases may be delivered with the oxygen, including, for example, helium, argon, nitrogen, or other materials.

Subsequent a first period of time, and while the plasma of the oxygen-containing precursor is maintained, a silicon-containing precursor may be flowed into the processing region of the semiconductor processing chamber at operation 215. The silicon-containing precursor may be delivered at a first flow rate that may be below a target flow rate for deposition in some embodiments. The flow rate of the silicon-containing precursor may be ramped over a period of time at operation 220. The flow rate may be ramped at a constant rate over this second period of time, or may be ramped at a scaling rate, either decreasing or increasing, during the second period of time until the silicon-containing precursor may reach the target flow rate, such as a second flow rate. A number of deposition operations may then be performed at operation 225, which may include proceeding with deposition at the target flow rate to produce a desired film thickness. By performing processes according to method 200, during subsequent etching operations, such as during a wet or dry etch, undercut etching at the film interface with an underlying structure may be minimized or prevented.

In some embodiments, a higher density film may be produced by further modulating flow rates and process conditions. For example, in some embodiments, once a target flow rate has been reached, which may have contributed to the deposition of a first amount of silicon-containing material, one or more additional operations may be performed. In some embodiments, the processes may include halting delivery of the silicon-containing precursor at optional operation 230. The halting may be performed while maintaining a flow rate of the oxygen-containing precursor, and may include maintaining the plasma. Additionally, the flow rate may be ramped back down to the first flow rate while deposition continues. This may produce a film section characterized by differing film properties from the first section in some embodiments.

For example, by increasing the TEOS or silicon precursor concentration as a fraction of the deposition precursors, a more tensile film may be produced, which may include additional carbon and/or hydrogen. Additionally, by decreasing the fraction of TEOS, a more compressive film may be produced, which may additionally or alternatively be performed if the plasma power may be increased. Consequently, deposition may be continued while these modifications of flow rate are performed, which may adjust film properties through the layer. These adjustments between a more compressive and a more tensile film may produce a film with tuned stress, as the layers may be formed to similar or different thicknesses. Accordingly, while a film with substantially neutral stress may be produced, a range of compressive and tensile stressed portions of the film may similarly be produced to provide a range of stress characteristics.

Additionally, in some embodiments the methods may also include extinguishing the plasma at optional operation 235. In some embodiments, the oxygen-containing precursor, such as oxygen, may be flowed continuously throughout this process, which may maintain pressure characteristics within the processing chamber, and may also operate as a purge of deposition byproducts. Consequently, the surface of the first deposited material may be cleaned by the flowing oxygen precursor. The process may then repeat to form another section. For example, the plasma may be reformed from the oxygen-containing precursor, and the silicon-containing precursor may be reflowed into the processing region. The operations may be similar to as previously performed to produce a second section of deposited material, where the flow rate of the silicon-containing precursor may be ramped over a period of time, which may be the same or different than in the first section of material deposited. Consequently, a film characterized by increased density may be formed through these repeated operations, which may be repeated any number of times. By utilizing diatomic oxygen as the oxidizing precursor, an increased deposition rate may be provided, which may produce films characterized by improved shrinkage characteristics over conventional techniques.

As noted above, the silicon-containing precursor may be TEOS in some embodiments, although other silicon-containing precursors are similarly encompassed by the present technology. The period of time for ramping, either up or down, may be variable based on the substrate geometry and characteristics, as well as the target flow rate and initial flow rate of the precursor. In some embodiments either or both time periods may be less than or about 1 minute, and may be less than or about 30 seconds, less than or about 20 seconds, less than or about 15 seconds, less than or about 10 seconds, less than or about 9 seconds, less than or about 8 seconds, less than or about 7 seconds, less than or about 6 seconds, less than or about 5 seconds, less than or about 4 seconds, less than or about 3 seconds, less than or about 2 seconds, less than or about 1 second, or less.

In some embodiments the first flow rate may be less than or about 50% of the target flow rate of the silicon-containing precursor, and may be less than or about 40% of the target flow rate, less than or about 30% of the target flow rate, less than or about 20% of the target flow rate, less than or about 10% of the target flow rate, or less. By utilizing a lower flow rate, less silicon material may be formed at the initial deposition. This may afford adequate time for byproducts to escape the film, which may reduce porosity and increase the film density.

By utilizing the oxygen plasma initially, such as for example on a silicon or silicon-containing substrate, although the process may be similarly performed on any other material, the oxygen may radicalize the surface, forming an oxygen-radicalized surface termination. Accordingly, this radicalized interface region may enhance reaction with the radical TEOS molecules when delivered, which may improve deposition at this surface. This may increase the density of the film, which may be maintained through the bulk or adjusted to deposition of a lower density film.

The ramping operation may be performed at a flow rate configured to slowly or quickly reach the target flow rate in some embodiments. For example, in some embodiments the flow rate may be increased at a rate of greater than or about 1 gram per second, and may be increased at a rate of greater than or about 2 grams per second, greater than or about 3 grams per second, greater than or about 4 grams per second, greater than or about 5 grams per second, greater than or about 6 grams per second, greater than or about 7 grams per second, greater than or about 8 grams per second, greater than or about 9 grams per second, greater than or about 10 grams per second, or more. Additionally, the flow rate may be increased within a range of from about 2 grams per second of the silicon-containing precursor to about 5 grams per second of the silicon-containing precursor. The flow rate ramping may also change over the ramping period to either go faster or slower over the ramping time. When the flow rate is ramped more slowly than this range, film deposition may not progress as uniformly, and extended exposure to plasma may impact the film. To improve uniformity of the delivery, a carrier gas as previously described may be provided at a flow rate of greater than or about 1 slm, and which may be greater than or about 2 slm, greater than or about 3 slm, greater than or about 4 slm, greater than or about 5 slm, greater than or about 6 slm, or greater.

When the flow rate is ramped more quickly than this range, deposition may occur more quickly, which may trap more byproducts, and may lead to increased porosity and lower density, as well as undercut of the film during etching if at the interfacial region. Accordingly, the flow rate may be increased at a measured rate to maintain a balance between film formation, and quality at the interface. The interfacial region may be characterized by a thickness of less than or about 10 nm prior to shifting to a lower density material, although the formation may be extended to maintain a higher density throughout the film section. In some embodiments the thickness of the higher density interfacial region may be less than or about 9 nm, less than or about 8 nm, less than or about 7 nm, less than or about 6 nm, less than or about 5 nm, less than or about 4 nm, less than or about 3 nm, less than or about 2 nm, less than or about 1 nm, or less.

By providing an increased density film at the interface, lower temperature deposition may be performed, while maintaining a quality interface during subsequent operations, and which may limit or prevent undercut during etching. Consequently, the present technology may allow deposition to be performed at a temperature of less than or about 450° C., and which may be performed at a temperature of less than or about 440° C., less than or about 430° C., less than or about 420° C., less than or about 410° C., less than or about 400° C., less than or about 390° C., less than or about 380° C., less than or about 370° C., less than or about 360° C., less than or about 350° C., less than or about 340° C., less than or about 330° C., less than or about 320° C., less than or about 310° C., less than or about 300° C., less than or about 290° C., or less.

By producing films with controlled stress characteristics, film shrinking may be limited or substantially prevented, while maintaining a desired stress characteristic of the combined film. For example, and depending on the thickness of the first amount of material and the second amount material, the combination layer may be characterized by an overall compressive stress of less than or about −70 MPa, and may be characterized by an overall compressive stress of less than or about −65 MPa, less than or about −60 MPa, less than or about −55 MPa, or less. Additionally, film shrinkage may be reduced by greater than or about 10% compared to a film formed conventionally during subsequent processing or atmospheric exposure, and may be reduced by greater than or about 15%, greater than or about 20%, greater than or about 25%, greater than or about 30%, greater than or about 35%, greater than or about 40%, greater than or about 45%, greater than or about 50%, greater than or about 55%, greater than or about 60%, or more.

The portions of the films formed may be to any particular thickness, although by forming the sections to lower thicknesses, the stress characteristics may be more consistent through the layers. Sections produced may be characterized by a thickness of less than or about 500 nm in some embodiments, and may be characterized by a thickness of less than or about 450 nm, less than or about 400 nm, less than or about 350 nm, less than or about 300 nm, less than or about 250 nm, less than or about 200 nm, less than or about 150 nm, less than or about 100 nm, less than or about 50 nm, or less. By repeating the process, the characteristics may be produced throughout the full thickness formed. Accordingly, in some embodiments, aspects of the methods may be repeated at least twice during processing, and may be repeated a number of times that is greater than or about 3 times, greater than or about 4 times, greater than or about 5 times, greater than or about 6 times, greater than or about 8 times, greater than or about 10 times, greater than or about 12 times, greater than or about 15 times, greater than or about 20 times, greater than or about 25 times, greater than or about 30 times, greater than or about 35 times, greater than or about 40 times, greater than or about 45 times, greater than or about 50 times, greater than or about 60 times, or more.

Figure 3A:
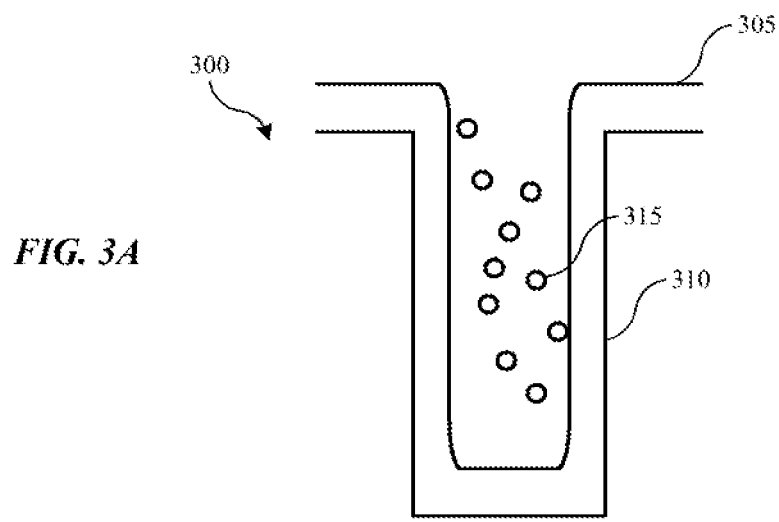
FIGS. 3A-3C show schematic cross-sectional views of exemplary substrates according to some embodiments of the present technology.
Figure 3B:
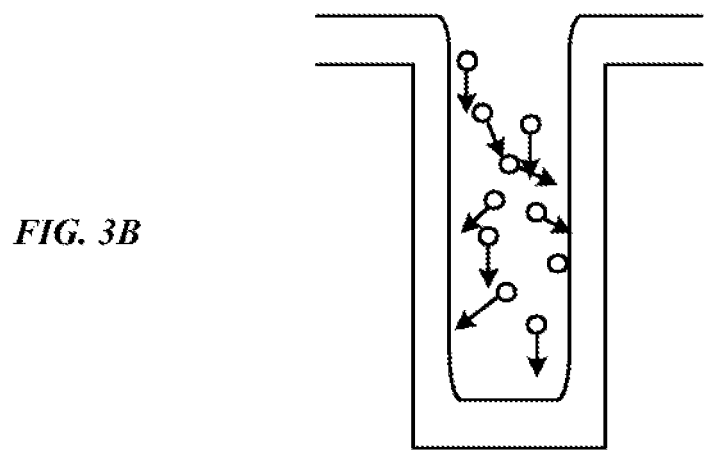
Figure 3C:
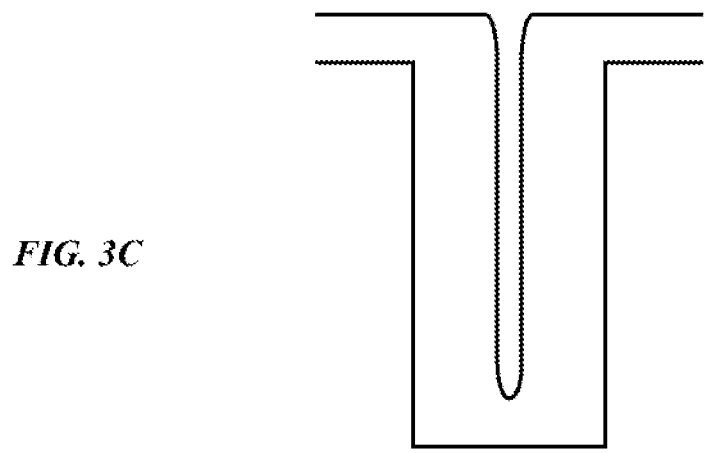

FIGS. 3A-3C show schematic cross-sectional views of exemplary substrate 300 according to some embodiments of the present technology. The figures illustrate aspects of the present technology by which improved conformality may be provided for improved step coverage or coverage of high aspect ratio features with the present technology. For example, conventional techniques may produce films characterized by less uniform sidewall coverage. This may in part be due to an isotropic nature of some deposition techniques, where low frequency energy is utilized in combination with high frequency energy during plasma formation. While high frequency energy may increase plasma density, low frequency energy may provide a directionality to the plasma species. However, the low frequency energy, such as a radio-frequency signal of less than or about 3 kHz, may increase directionality of deposition, which may lower sidewall coverage in a feature. As the plasma species may be produced above the substrate, a higher percentage of the material may be directed to a bottom and top of the feature, which may cause pinch off and void formation. The present technology may at least partially overcome these issues by cycling the deposition as previously described.

FIG. 3A may illustrate a film 305 being deposited on a substrate 310, which may define a feature, such as a high-aspect ratio feature as illustrated, although any number of features or profiles may similarly be encompassed by the present technology. The substrate may be any substrate previously described, and may be a substrate being processed by one or more operations of method 200, performed in a processing chamber, such as processing chamber 100 described previously. After a first portion of the film has been formed, flow of a silicon-containing precursor may be halted, along with delivery of one or more radio-frequency signals, such as the high and/or low frequency signals, which may similarly cease formation of the plasma. However, the oxygen-containing precursor, such as diatomic oxygen, may continue to be flowed. Consequently, oxygen molecules 315 may permeate the recess of the feature as illustrated in FIG. 3A. Accordingly, when the plasma is reignited, particle collisions within the feature may increase as illustrated in FIG. 3B, which may direct more radical species towards the sidewalls. This may increase reactive terminations, and otherwise improve the surface for deposition. Consequently, deposition may occur more conformally along sidewall features as illustrated in FIG. 3C.

For example, in some embodiments a thickness of deposited material along a sidewall proximate or at a bottom of a feature may be characterized by a film formation thickness that is at greater than or about 75% of a film formation thickness of deposited material along the sidewall proximate or at a top of the feature. Additionally, thickness proximate the bottom may be greater than or about 80% the thickness proximate the top, greater than or about 85% the thickness, greater than or about 90% the thickness, greater than or about 95% the thickness, greater than or about 99% the thickness, or the thickness proximate the bottom may be substantially similar or equal to the thickness proximate the top in some embodiments. Accordingly, void formation may be reduced as more conformal coverage may be provided.

By utilizing methods according to embodiments of the present technology, material deposition or formation may be improved. By providing densified material at an interface, film shrinkage may be reduced, and undercut may be limited of prevented. These improvements may reduce film peeling on a substrate, and may limit downstream damage to the film.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A deposition method comprising:
    forming a plasma of an oxygen-containing precursor within a processing region of a semiconductor processing chamber, wherein the processing region houses a semiconductor substrate on a substrate support;
    while maintaining the plasma of the oxygen-containing precursor, flowing a silicon-containing precursor into the processing region of the semiconductor processing chamber at a first flow rate;
    ramping the first flow rate of the silicon-containing precursor over a period of time to a second flow rate greater than the first flow rate; and
    depositing a silicon-containing material on the semiconductor substrate.

2. The deposition method of claim 1, wherein the silicon-containing precursor comprises tetraethyl orthosilicate.

3. The deposition method of claim 1, wherein the period of time is less than or about 10 seconds.

4. The deposition method of claim 1, wherein ramping the first flow rate occurs at a constant increase of from about 2 grams per second of the silicon-containing precursor to about 5 grams per second of the silicon-containing precursor.

5. The deposition method of claim 1, wherein the depositing is performed at a temperature of less than or about 450° C.

6. The deposition method of claim 1, wherein the processing region of the semiconductor processing chamber is maintained free of the silicon-containing precursor while forming the plasma of the oxygen-containing precursor.

7. The deposition method of claim 1, wherein the semiconductor substrate comprises silicon, and wherein forming the plasma of the oxygen-containing precursor produces an oxygen-radicalized surface termination of the silicon of the semiconductor substrate.

8. The deposition method of claim 1, further comprising:
    subsequent depositing a first amount of the silicon-containing material, halting delivery of the silicon-containing precursor while maintaining a flow rate of the oxygen-containing precursor.

9. The deposition method of claim 8, further comprising:
    extinguishing a plasma within the processing region of the semiconductor processing chamber while maintaining a flow rate of the oxygen-containing precursor.

10. The deposition method of claim 9, further comprising:
    reforming a plasma of the oxygen-containing precursor, and
    reflowing the silicon-containing precursor into the processing region of the semiconductor processing chamber.

11. A deposition method comprising:
    flowing an oxygen-containing precursor into a processing region of a semiconductor processing chamber, wherein the processing region houses a semiconductor substrate on a substrate support;
    forming a plasma of the oxygen-containing precursor;
    flowing a silicon-containing precursor into the processing region of the semiconductor processing chamber;
    increasing a flow rate of the silicon-containing precursor over a period of time;
    depositing a first amount of a silicon-containing material on the semiconductor substrate; and
    halting a flow of the silicon-containing precursor and formation of the plasma, while maintaining a flow rate of the oxygen-containing precursor.

12. The deposition method of claim 11, wherein the oxygen-containing precursor comprises diatomic oxygen.

13. The deposition method of claim 11, further comprising:
    reforming the plasma of the oxygen-containing precursor,
    reflowing the silicon-containing precursor into the processing region of the semiconductor processing chamber; and
    increasing the flow rate of the silicon-containing precursor over the period of time.

14. The deposition method of claim 13, wherein the method is repeated at least five times.

15. The deposition method of claim 11, wherein the semiconductor substrate is characterized by a recessed feature, and wherein sidewall coverage proximate a bottom of the recessed feature is greater than or about 75% a thickness of sidewall coverage proximate a top of the recessed feature.

16. A deposition method comprising:
    forming a plasma of an oxygen-containing precursor within a processing region of a semiconductor processing chamber, wherein the processing region houses a semiconductor substrate on a substrate support;
    while maintaining the plasma of the oxygen-containing precursor, flowing a silicon-containing precursor into the processing region of the semiconductor processing chamber at a first flow rate;
    ramping the first flow rate of the silicon-containing precursor over a first period of time to a second flow rate greater than the first flow rate;
    depositing a first amount of silicon-containing material on the semiconductor substrate, wherein the first amount of silicon-containing material is characterized by a tensile stress;
    ramping the first flow rate of the silicon-containing precursor over a second period of time from the second flow rate to the first flow rate; and
    depositing a second amount of silicon-containing material on the semiconductor substrate, wherein the second amount of silicon-containing material is characterized by a compressive stress.

17. The deposition method of claim 16, wherein a stack of silicon-containing material deposited is characterized by a substantially neutral stress.

18. The deposition method of claim 16, wherein the first amount of silicon-containing material is characterized by a different thickness than the second amount of silicon-containing material on the semiconductor substrate.

19. The deposition method of claim 16, wherein the method is repeated at least five times.

20. The deposition method of claim 16, wherein the silicon-containing precursor is tetraethyl orthosilicate, and wherein the oxygen-containing precursor is diatomic oxygen.

* * * * *